United States Patent [19]
Natesan

[11] Patent Number: 5,376,458
[45] Date of Patent: Dec. 27, 1994

[54] STRUCTURAL ALLOY WITH A PROTECTIVE COATING CONTAINING SILICON OR SILICON-OXIDE

[75] Inventor: Ken Natesan, Naperville, Ill.

[73] Assignee: The United States of America as represented by the United States Department of Energy, Washington, D.C.

[21] Appl. No.: 983,188

[22] Filed: Nov. 30, 1992

[51] Int. Cl.$^5$ .............................................. C23C 14/24
[52] U.S. Cl. ...................... 428/472; 428/336; 428/469; 428/697; 428/699; 428/701; 428/702
[58] Field of Search ............... 428/469, 472, 697, 701, 428/702, 336, 699

[56] References Cited
U.S. PATENT DOCUMENTS 4,216,015  8/1980  Hickl et al. ................. 75/134 F
4,804,587  2/1989  Takeuchi et al. .................. 428/623

FOREIGN PATENT DOCUMENTS 3026355  2/1988  Japan .

OTHER PUBLICATIONS

Kashomoto et al "Surface Modification of Stainless Steels by In-Line Dig Coating Technology" Surface and Coating Technology 36 (1988) p 837-845.
Corrosion and Mechanical Behavior of Materials for Coal Gasification Applications by K. Natesan Argonne National Laboratory Report ANL 80-5 dated May 1980.

*Primary Examiner*—A. A. Turner
*Attorney, Agent, or Firm*—Bradley W. Smith; Hugh W. Glenn; William R. Moser

[57] ABSTRACT

An iron-based alloy containing chromium and optionally, nickel. The alloy has a surface barrier of silicon or silicon plus oxygen which converts at high temperature to a protective silicon compound. The alloy can be used in oxygen-sulfur mixed gases at temperatures up to about 1100° C.

6 Claims, 8 Drawing Sheets

STRUCTURAL ALLOY WITH A PROTECTIVE COATING CONTAINING SILICON OR SILICON-OXIDE

CONTRACTUAL ORIGINS OF THE INVENTION

The United States Government has rights in this invention pursuant to Contract No. W-31-109-ENG-38 between the U.S. Department of Energy and the University of Chicago representing Argonne National Laboratory.

BACKGROUND OF THE INVENTION

This invention relates to ferrous metal alloys with surfaces protected by Si compositions and, more particularly, to Fe-Cr alloys with protective coatings containing Si and/or Si-O for use in oxygen/sulfur mixed-gas environments.

Ferrous metal alloys and particularly Fe-Cr or Fe-Cr-Ni alloys may be identified as structural alloys and have use in the fabrication of coal gasifiers, coal combustion units, and other equipment designed to operate at temperatures in the order of 500°–1000° C. Upon exposure to aggressive gaseous environments at elevated temperatures, these alloys depend on their ability to form and maintain protective surface oxide scales to minimize the rate of corrosive degradation. However, in oxygen-sulfur mixed-gas environments, typical of those encountered in coal gasification and combustion atmospheres, it has been determined that most of the structural alloys will tend to have difficulty developing an oxide scale and that in the absence of protective oxide layers, the rates of alloy degradation, due to sulfur attack, will be prohibitively high for practical applications.

Also, even if a structural alloy is capable of developing a protective oxide scale after short-term exposure to mixed-gas environments, the life expectation for the alloy is strongly dependent on whether the alloy exhibits "breakaway" or "accelerated" corrosion. This type of corrosion may be a particular problem under significant changes in temperature. Most of the structural alloys, in general, exhibit breakaway corrosion, especially in oxygen/sulfur mixed-gas atmospheres with the exposure time at which it occurs being dependent on temperature, gas chemistry, alloy composition and scale microstructure. During temperature cycling conditions, breakdown of scales can occur due to the difference in thermal expansion properties between scales and alloy substrates due to growth stresses that are generated during oxidation. In order to minimize corrosion rates for an alloy under exposure to sulfur environments and therefore to minimize breakaway corrosion, it is important to minimize the outward transport of cations and inward transport of sulfur with respect to the surface alloy. One of the techniques for lowering the corrosion rates for a structural alloy is to develop a barrier layer on the surface of the material to be protected in the service environment.

As reported in K. Natesan, "Corrosion and Mechanical Behavior of Materials for Coal Gasification Applications", *Argonne National Laboratory Report ANL-80-5*, May, 1980, barrier layers as coatings of Al or Cr have been formed or applied on structural alloys with varying results. Several have been porous and limited the desired protection provided to the underlying alloy. In general, the coatings have been 10 mils or more in thickness and have separated or broken away from the underlying alloy when the coated alloys have been subjected to temperature cycling conditions.

Accordingly, one object of this invention is a structural alloy with a surface protected from oxygen/sulfur mixed-gas environments. Another object of the invention is a structural alloy with a nonporous, protective surface coating. Yet another object of the invention is a structural alloy with a protective surface coating resistant to separation from the underlying alloy. A further object of the invention is a structural alloy with a protective surface coating forming a barrier to sulfur attack on the underlying metals.

SUMMARY OF THE INVENTION

Briefly, the invention relates to a structural alloy with a protective coating containing Si or Si-O with the coating being nonporous and resistant to separation from the underlying alloy, and to a method of forming the desired coating. The Si or Si-O is preferably applied by sputtering to form a thin coating less than 50 $\mu$m and preferably 1–10 $\mu$m to avoid separation problems. After formation of the coating, the product is subjected to elevated test or operating temperatures in the order of 700°–1100° C. and silicides of Cr and Si and oxide products [Si,Cr oxide] of the silicides are formed from the Si coating with the coating of Si plus oxygen formed silica with some chromium content. It appears that the silicides and the oxides of Si with or without chromium provide the protective barrier to attack by corrosive gases. With the coating being below 50 $\mu$m, breakaway corrosion is also avoided.

Structural alloys of primary importance are the iron-based alloys containing chromium in the range of 9–30 wt. % and nickel in the range of 10–25 wt. %.

EXAMPLES

Exposure tests were carried out in low and high sulfur environments with samples of a Fe-25 wt. % Cr alloy with protective surfaces of some samples being formed by rf sputtered deposits of Si or Si-O. The base alloy was obtained from Carpenter technology with a composition of Fe-25 wt. % Cr. The sputter deposition was carried out from a silicon target (about 20 cm in diameter) as the cathode unto substrate coupons (about 1 cm $\times$ 1 cm $\times$ 0.75 mm in size) of the alloy with argon gas under vacuum. The target and substrate supports were water cooled; as a result, the temperature of the coupons was maintained at values below about 200° C. Approximately 24 coupon specimens were used in a given sputter-deposit run carried out for about 2 hours to produce samples for a test. The coupon specimens, supported on a pedestal, were rotated during the sputtering operation to achieve a uniform deposit of silicon. The thicknesses of the sputter deposit layers were in the range of 1.0–1.25 $\mu$m as analyzed by Auger Electron Spectroscopy and interferometric microscope. Where Si plus O sputter layers were applied, a small amount of Argon-1 vol. % oxygen gas was bled into the deposition chamber.

Thermogravimetric analysis (TGA) tests were conducted using a CAHN electrobalance with a sample capacity of 2.5 g and a sensitivity of 0.1 $\mu$g, and a furnace with three-zone Kanthal heating elements with a temperature capability of about 1100° C. in continuous operation. The test specimens were suspended from the balance with approximately 200 $\mu$m diameter platinum wire. Tests were started at room temperature by purging the system with the appropriate reaction gas mixture after which the specimen was heated in the reaction gas to the desired test temperature with the heating time being normally less than 1200 s. Reaction gas mixtures for the tests were high purity air, a 1 vol. % CO—$CO_2$ gas (low-$pO_2$ environment), and two gases containing CO, $CO_2$, $H_2$ and $H_2S$ in amounts to be characterized as a low sulfur gas and a high sulfur gas. Table I below lists the calculated oxygen and sulfur partial pressures established by different reaction gas mixtures. Upon completion of the test, the furnace was opened and the specimen was cooled rapidly in the reaction gas environment. The cooling time to reach approximately 100° C. was generally less than 600 s.

TABLE I

| Calculated Partial Pressures (in atm) of Oxygen and Sulfur in Various Reaction Gas Mixtures at 700° C. | | |
|---|---|---|
| Gas Mixture | $pO_2$ | $pS_2$ |
| Air | 0.21 | — |
| 1 vol. % CO—$CO_2$ | $5.45 \times 10^{-18}$ | — |
| Low-$pS_2$ Gas | $1.91 \times 10^{-21}$ | $3.1 \times 10^{-10}$ |
| High-$pS_2$ Gas | $1.93 \times 10^{-21}$ | $2.5 \times 10^{-8}$ |

Figure 1:
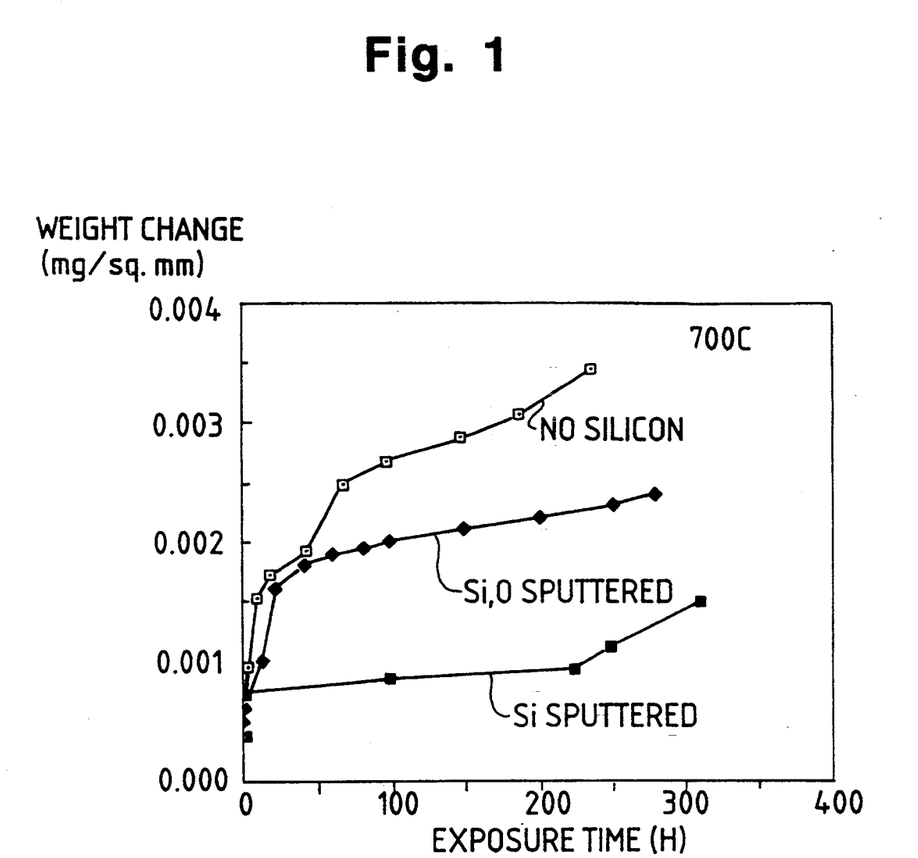
FIG. 1 is a graph showing weight change data from exposure to air at 700° C. for a Fe-25 wt. % Cr alloy with and without protective surfaces provided by the invention.
Figure 2:
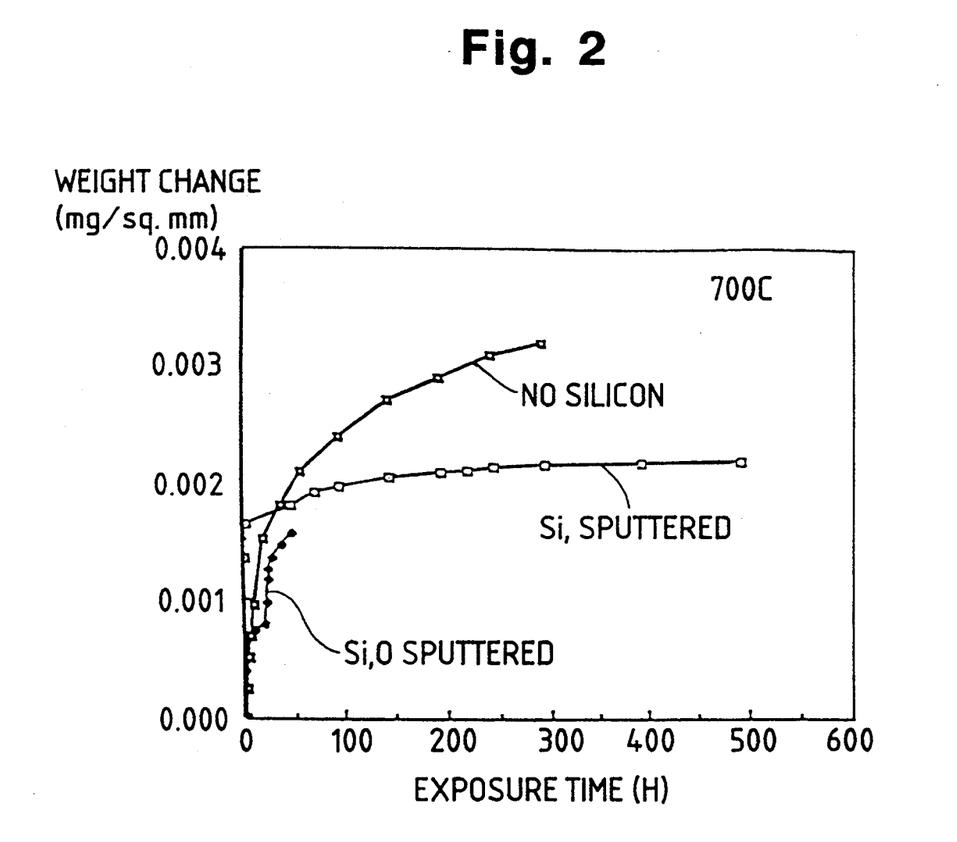
FIG. 2 is a graph showing weight change data from exposure to a low-oxygen gas environment for a Fe-25 wt. % Cr alloy with and without protective surfaces provided by the invention.
Figure 3:
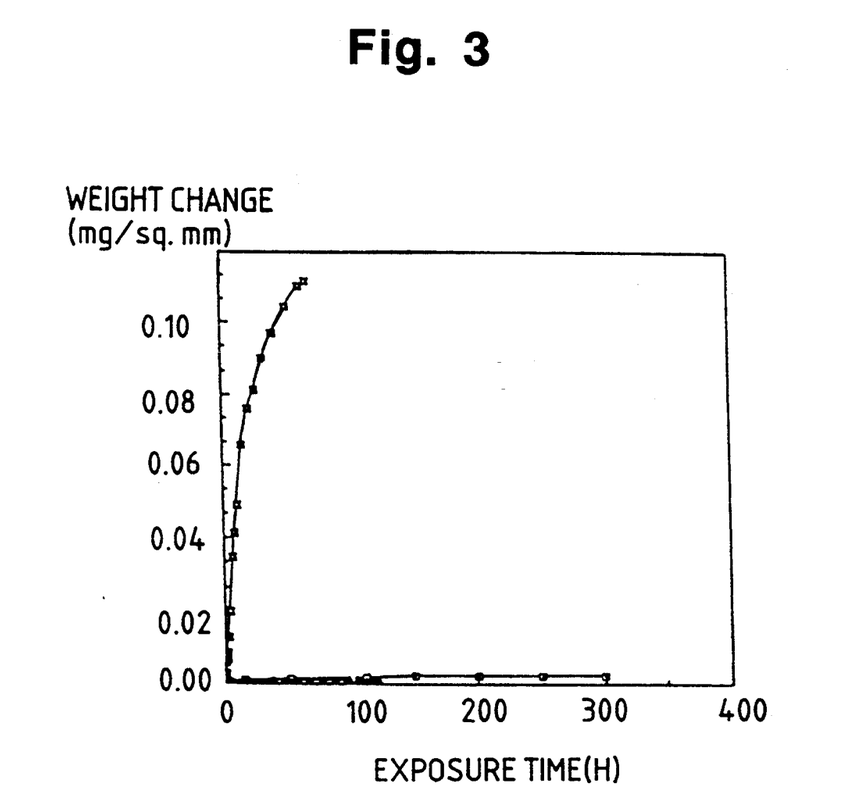
FIG. 3 is a graph showing weight change data from exposure to a low-sulfur mixed-gas environment for a Fe-25 wt. % Cr alloy with and without protective surfaces provided by the invention.
Figure 4:
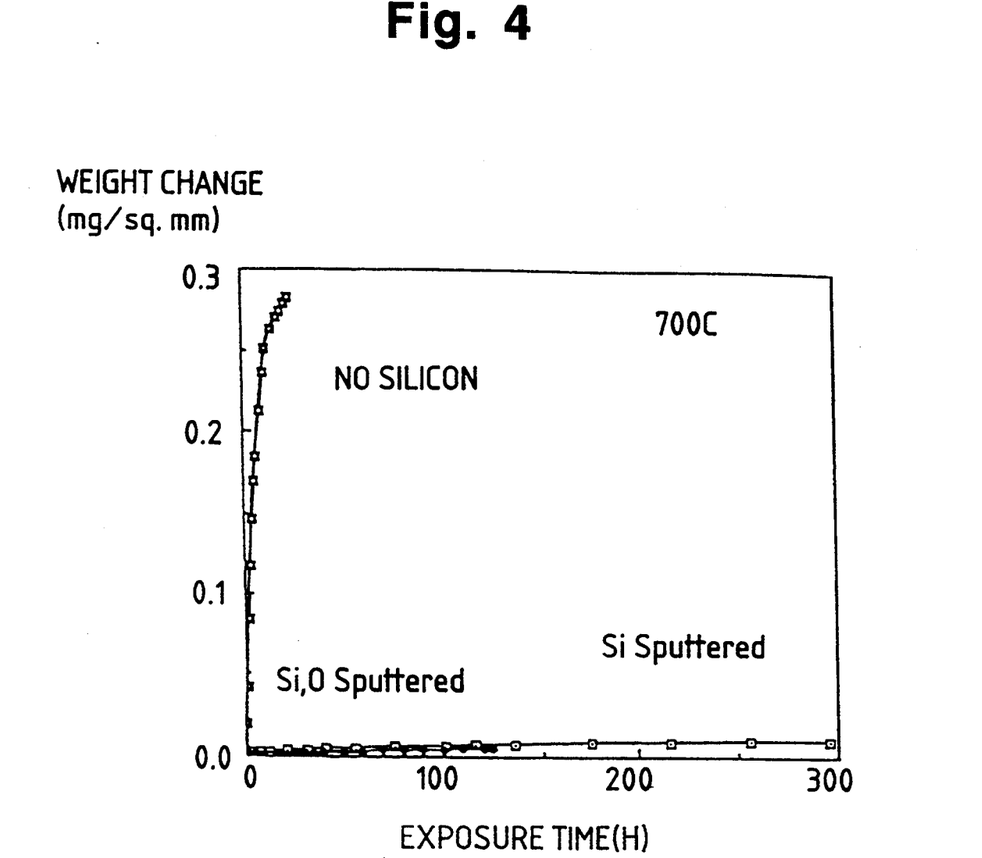
FIG. 4 is a graph showing weight change data from exposure to a high-sulfur mixed-gas environment for a Fe-25 wt. % Cr alloy with and without protective surfaces provided by the invention.
Figure 5:
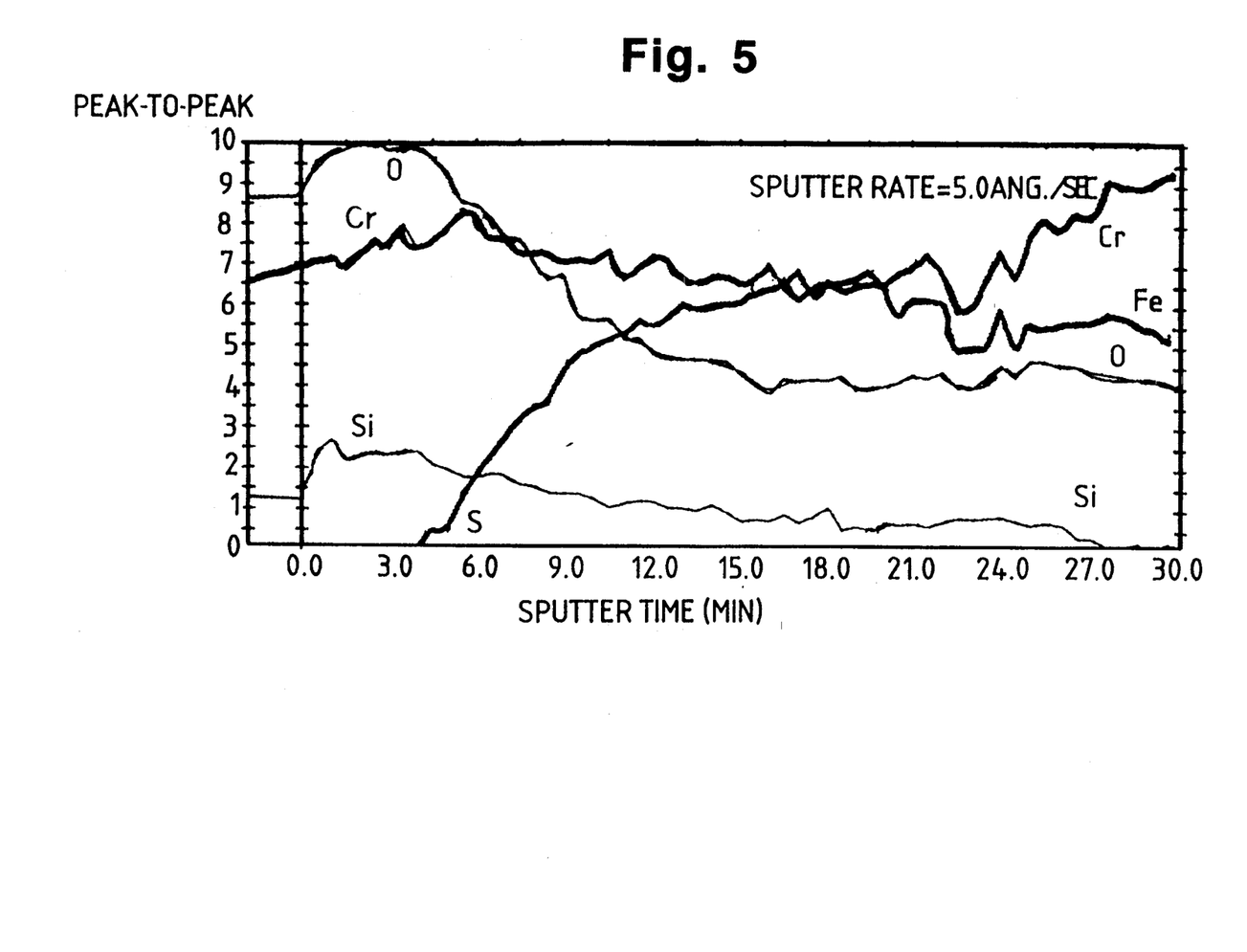
FIG. 5 is an AES depth profile analysis for Fe-25 wt. % Cr alloy with a sputtered Si surface of FIG. 3 as an illustration of the invention and after exposure to a low-sulfur mixed-gas environment.
Figure 6:
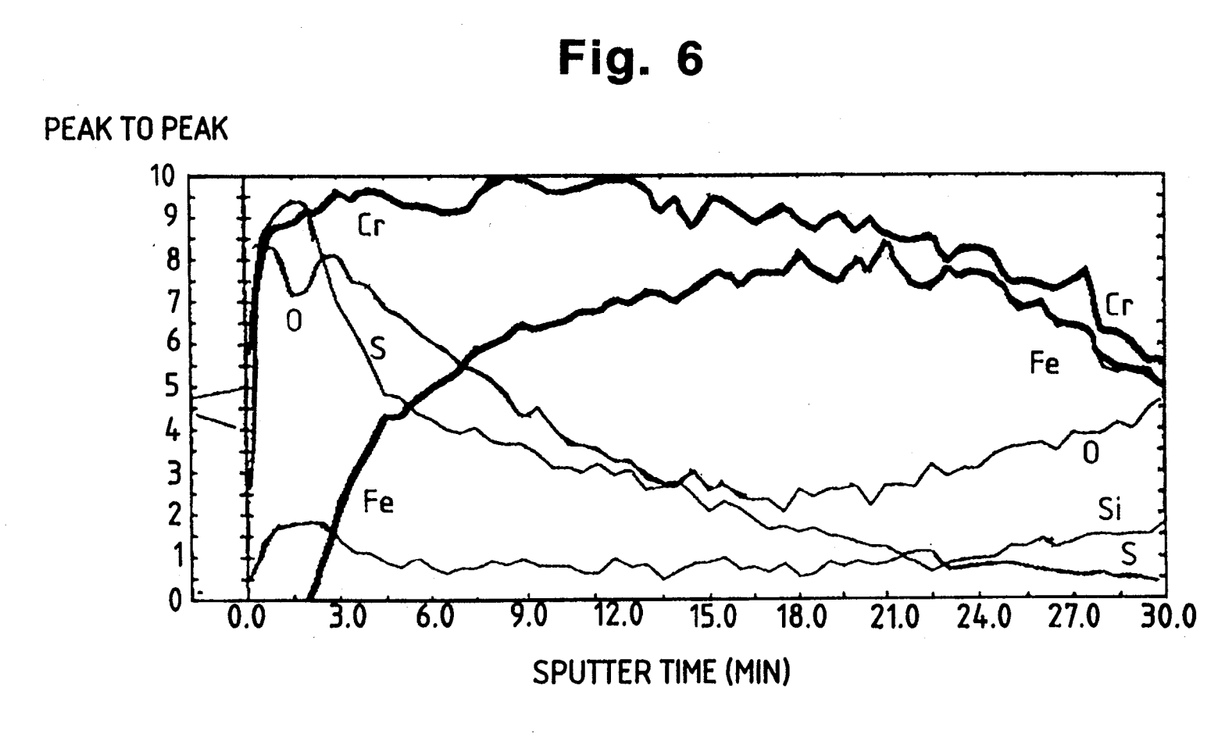
FIG. 6 is an AES depth profile analysis for Fe-25 wt. % Cr alloy with a sputtered Si surface of FIG. 4 as an illustration of the invention and after exposure to a high-sulfur mixed-gas environment.
Figure 7:
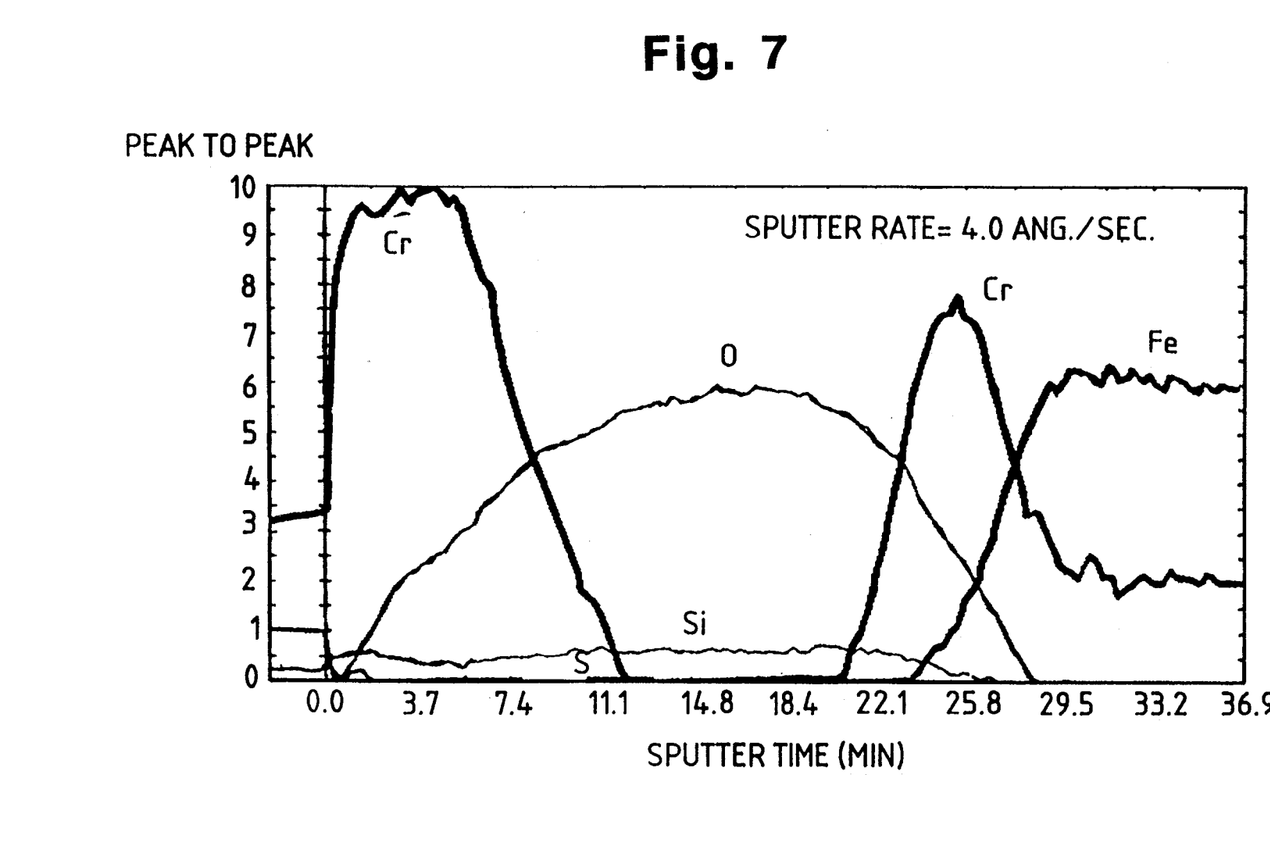
FIG. 7 is an AES depth profile analysis for Fe-25 wt. % Cr alloy with a sputtered Si-O surface of FIG. 3 as an illustration of the invention and after exposure to a low-sulfur mixed-gas environment.
Figure 8:
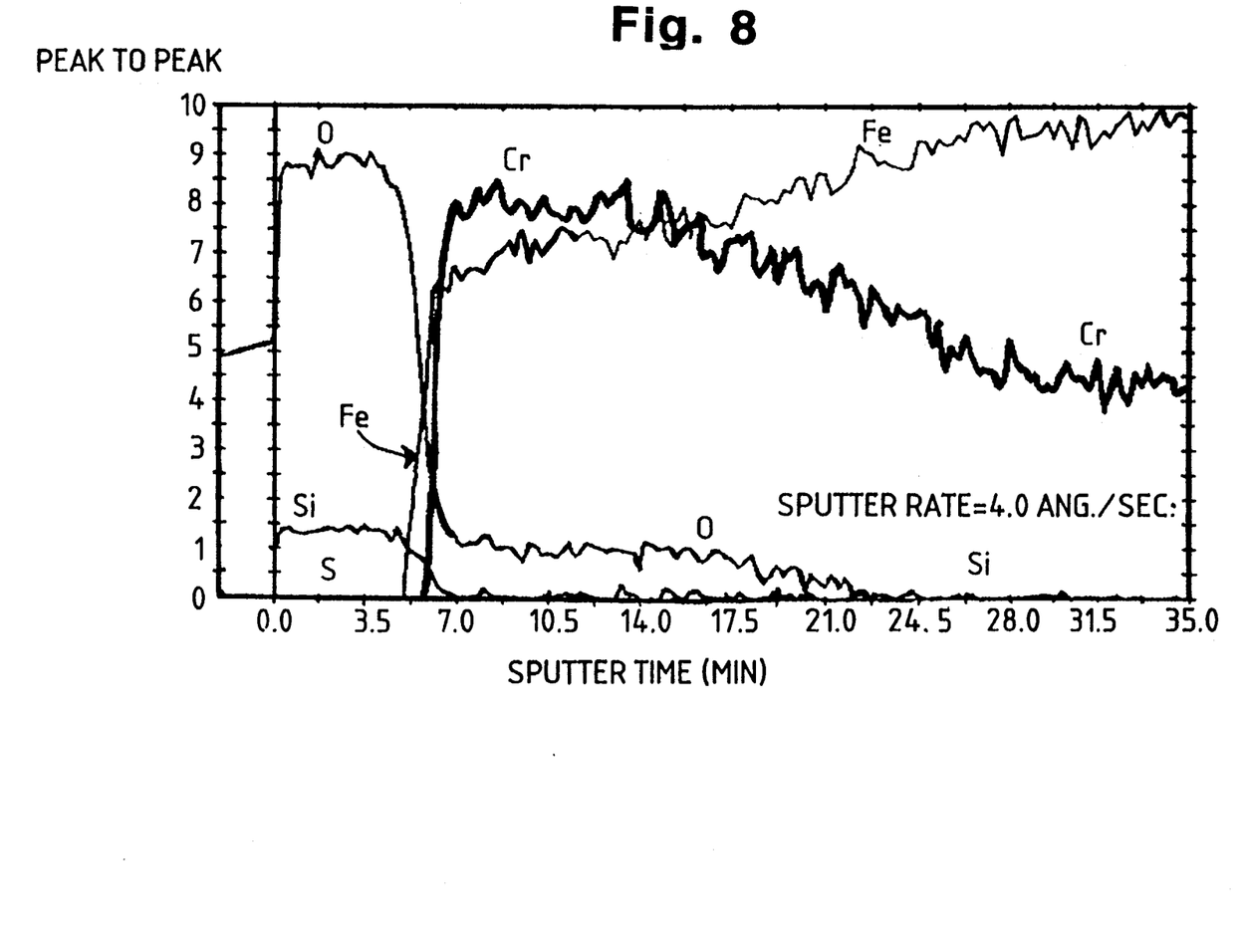
FIG. 8 is an AES depth profile analysis for Fe-25 wt. % Cr alloy with a sputtered Si-O surface of FIG. 4 as an illustration of the invention and after exposure to a high-sulfur mixed-gas environment.

After the thermogravimetric tests, the corrosion product scales were analyzed by means of several electron-optical techniques. A scanning electron microscope equipped with an energy dispersive x-ray analyzer was used to examine the exposed surfaces and cross sections. Auger electron spectroscopy (AES) was used to determine the depth profiles of several exposed specimens, especially those tested in sulfur-containing environments. The results are shown in FIGS. 1 through 4 on the behavior of coated and uncoated Fe-25 wt. % Cr alloy samples exposed to the different reaction gases. FIGS. 5 through 8 show the AES depth profiles for Si and Si plus O sputtered specimens after exposure to low- and high-sulfur environments. The results clearly show that silicon containing protective layers can be formed to protect the underlying alloy from attack by the corrosive gases. The results also show that the protective layers contain Cr, Si and oxygen together with an internal layer of chromium oxide, both of which offer resistance to sulfur penetration.

Thermal cycling tests were carried out with sputter deposited specimens in oxygen/sulfur environment. The temperature was cycled between room temperature and approximately 700° C. Each cycle was approximately 18 hours. After approximately 30 cycles, the test specimens showed resistance to spallation of the protective layers. Post exposure characterization of the corrosion product layers showed that Si and Si plus O promote formation of complex surface oxide layers which are nonporous and act as barriers to migration of sulfur from the gas phase to the base alloys, thereby significantly reducing the corrosion rates for the coated alloys.

The sputter deposited samples, Si and Si plus oxygen, were examined before and after exposure to the corrosive environments in Table I, using Auger Electron Spectroscopy and Rutherford backscattering techniques. The Auger analysis is confined to nanometer thick quantities of material. As a result, the specimen was sputtered with argon to obtain a concentration-depth profile for several of the exposed specimens. The Auger analysis of the exposed specimens showed that the Si sputtered specimens developed predominantly (Si,Cr) oxide which acted as a barrier to sulfur transport inwards from the gas phase into the alloy and iron transport outward from the alloy to the gas side. Rutherford backscattering technique analysis conducted with 1.5 and 3.0 MEV helium showed that the Si sputtered specimens formed silicides with chromium at temperatures as low as 500° C. and that both these elements reacted with the exposure environment to form (Si,Cr) oxide, which acted as a barrier to the transport of sulfur and corrosion. Specimens with a sputter deposit of silicon plus oxygen were also corrosion tested under oxidizing and sulfidizing environments in Table I. The specimens predominantly formed silica (with some chromium content) scale upon exposure to these corrosive environments. The scale, being thin and adherent to the substrate alloy, showed resistance to sulfur attack. Depth profiles obtained by Auger analysis confirmed the formation silicon containing scale. Rutherford backscattering analysis (of thicker layers near the surface) showed scales that contained mostly silicon and chromium, but no sulfur or iron was detected.

These results show that incorporation of silicon into an iron base alloy leads to formation of Cr silicide which oxidizes in corrosive environment to form (Si,Cr) oxide that resists transport of sulfur and iron and substantially minimized corrosion of the underlying alloy. Incorporation of silicon plus oxygen leads to the formation of Si oxide or (Si,Cr) oxide upon exposure to corrosive environment which again is resistant to sulfur corrosion.

DETAILED DESCRIPTION OF THE PREFERRED EMBODIMENT

In this invention, iron-based alloys of particular interest are those containing chromium to provide the desired protection and include those containing chromium in the range of 9–30 wt. %. Nickel may also be present in about 10–25 wt. % with iron being the predominant remaining component other than the small amounts of Si or Si-O added by the surface treatment.

Advantageously, the alloy treatment is carried out by sputtering silicon in a vacuum or in the presence of a small amount of oxygen on the alloy surface to produce a deposit less than 50 $\mu$m and preferably in the range of 1–10 $\mu$m. Temperatures are usually less than 200° C. and preferably lower than 400° C. to minimize microstructural changes in the substrate alloy.

The initial treatment of the alloy by forming a coating of silicon or silicon plus oxygen on the alloy surface is followed by heating the alloy to an elevated temperature above about 500° C. and preferably 500°–1000° C. which results in the formation of a silicide and/or oxide of silicon or silicon and chromium.

Subsequently, the modified alloy is heated to temperatures in the order of 500°–700° C. Examination of the samples show that the Si sputtered samples formed silicides with chromium at temperatures as low as 500° C. and both these elements reacted with the exposure environment to form (Si, Cr) oxide which acted as a barrier to transport of sulfur and corrosion.

Sputtering with silicon plus oxygen forms silica with some chromium content on the surface upon exposure at temperatures of 500°–700° C. to corrosive environments. The scale shows resistance to sulfur attack.

With no surface treatment of the alloy, corrosion at temperatures above about 500° C. is accelerated by the migration of iron to the surface. The addition of silicon or silicon plus oxygen to the surface provides a condition under which the silicon or silicon plus oxygen are converted to a silicide or oxide of silicon with or without chromium.

The embodiments of this invention in which an exclusive property or privilege is claimed are defined as follows:

1. A coated iron-based alloy resistant to corrosion at high temperatures in oxygen/sulfur mixed gases, the alloy consisting essentially of Fe and Cr with optional levels of Ni below about 25 wt. % and with a surface barrier of Si having a thickness less than 10 $\mu$m, the Si in the barrier is exposed to temperatures above about 500° C. and is converted to a multilayer barrier having an inner layer of chromium oxide and an outer layer of a Cr silicide.

2. The alloy of claim 1 wherein said alloy consists essentially of Fe, about 9–30 wt. % Cr and when Ni is present, about 10–25 wt. % Ni.

3. A coated iron-based alloy resistant to corrosion at high temperatures in oxygen/sulfur mixed gases, the alloy consisting essentially of Fe and Cr with optional levels of Ni below about 25 wt. % and with a multilayer barrier having an interior layer of chromium oxide and an outer layer of (Cr, Si) oxide prepared by a process consisting essentially of:

applying a surface barrier of silicon to the alloy surface and heating said surface barrier to temperatures above about 500° C. to form an initial multilayer barrier with an inner layer of chromium oxide and an outer Cr silicide layer where the silicon surface barrier has a thickness of less than 10 $\mu$m;

heating the alloy to a temperature above about 500° C. and exposing said initial multilayer barrier to a oxygen/sulfur mixed gas environment, resulting in the conversion of the Cr silicide layer to a (Si,Cr) oxide layer.

4. A coated iron-based alloy resistant to corrosion at high temperatures in oxygen/sulfur mixed gases, the alloy consisting essentially of Fe and Cr with optional levels of Ni below about 25 wt. % and with a surface barrier of Si plus O having a thickness less than 10 $\mu$m, where the Si plus O in the barrier is exposed an initial heating to temperatures above about 500° C. followed by a subsequent heating of said barrier to temperatures in excess of 500° C. in an environment containing oxygen/sulfur mixed gases and where said barrier responds to said heating and to said environment to form a multilayer barrier having an inner layer of chromium oxide and an outer layer of silica and chromium.

5. The alloy of claim 4 wherein said alloy consists essentially of Fe, about 9–30 wt.% Cr and when Ni is present, about 10–25 wt. % Ni.

6. The coated alloy of claim 1 wherein said Cr silicide layer is exposed to temperatures in excess of 500° C. in an environment containing oxygen/sulfur mixed gases where said silicide layer reacts with said environment to form a (Si,Cr) oxide layer.

* * * * *